US006835999B2

(12) United States Patent
Omura et al.

(10) Patent No.: US 6,835,999 B2
(45) Date of Patent: Dec. 28, 2004

(54) SEMICONDUCTOR DEVICE AND METHOD OF MANUFACTURING THE SAME

(75) Inventors: Mitsuhiro Omura, Yokohama (JP); Fumio Sato, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/458,267

(22) Filed: Jun. 11, 2003

(65) Prior Publication Data

US 2004/0012073 A1 Jan. 22, 2004

(30) Foreign Application Priority Data

Jun. 12, 2002 (JP) ........................................ 2002-171371

(51) Int. Cl.[7] .............................................. H01L 29/00
(52) U.S. Cl. ...................................... 257/529; 257/758
(58) Field of Search ................................. 257/529, 758, 257/77, 762, 765, 773

(56) References Cited

U.S. PATENT DOCUMENTS 4,432,035 A * 2/1984 Hsieh et al. ................. 361/322
6,593,207 B2 * 7/2003 Hong et al. .................. 438/424
2002/0079552 A1 * 6/2002 Koike ......................... 257/529
2004/0012073 A1 * 1/2004 Omura et al. ................ 257/529

FOREIGN PATENT DOCUMENTS

JP        2001-135792       5/2001
JP        2001-176976       6/2001

* cited by examiner

Primary Examiner—Mark V. Prenty
(74) Attorney, Agent, or Firm—Finnegan, Henderson, Farabow, Garrett & Dunner, L.L.P.

(57) ABSTRACT

Disclosed is a semiconductor device comprising a semiconductor substrate, a first metal wiring and a fuse, both being formed as the same level above the semiconductor substrate, a first insulating film formed on the first metal wiring and the fuse, the first insulating film having a first pad opening arriving at the first metal wiring, a second metal wiring formed at least within the first pad opening, the second metal wiring not extending above the fuse, a stopper film formed on the first insulating film and the second metal wiring, and a second insulating film formed above the stopper film. A second pad opening is formed to expose the second metal wiring by removing the second insulating film and the stopper film, a fuse opening is formed above at least the fuse by removing the second insulating film and the stopper film, and by removing the first insulating film incompletely.

17 Claims, 5 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-171371, filed Jun. 12, 2002, the entire contents of which are incorporated herein by reference.

BACKGROUND OF THE INVENTION

1. Field of the Invention

This invention relates to a semiconductor device provided with a fuse for a redundancy circuit as seen in a embedded memory device, and in particular, to a semiconductor device which is improved in the fuse and pad portions thereof, and to a method for manufacturing such a semiconductor device.

2. Description of the Related Art

When a fuse for utilizing a redundancy technique is formed on a surface of semiconductor substrate, the fuse is conventionally formed in a metal wiring layer which is disposed next to the second layer as counted downward from the metal pad. However, concomitant with the recent trend to further multiply the wiring layers, the metal wiring layer which is disposed below next to the uppermost metal wiring layer is prone to be made larger in thickness, resulting in an increase in thickness also of the interlayer insulating film which is disposed on the surface of the fuse.

On the occasion of forming a fuse window, it is required not only to work this thickened interlayer insulating film but also to leave the interlayer insulating film on the surface of the fuse. In spite of the requirement that the film thickness of the interlayer insulating film to be left behind on the surface of the fuse be made as thin as possible in order to enable the fuse to be stably cut out by laser blow, the interlayer insulating film to be worked is made very large in thickness, as explained above, thereby making it very difficult to control the working of the interlayer insulating film.

Further, in order to comply with the enhancement of the processing speed of semiconductor devices in recent years, the minimization of the delay of electric current in the metal wiring has become an major problem. It has been considered necessary to employ, as a countermeasure for solving the aforementioned problem, an insulating film which is low in dielectric constant (low-k film) as an interlayer insulating film to be interposed between the metal wirings. In this case, it is quite conceivable to fabricate a structure where this low-k film is disposed next to the second layer as counted downward from the metal pad. If so, the fuse in this low-k film will be cut out by laser blow, which however leads to the damage of this low-k film by the laser blow, thus badly affecting the characteristics and reliability of the semiconductor device.

As explained above, in the case of a semiconductor device such as a embedded memory device, concomitant with the trend to multiply wiring layers, the metal wiring layer which is disposed below next to the uppermost metal wiring layer as well as the interlayer insulating film disposed on the surface of the fuse are prone to be made larger in thickness, and due to this increase in thickness of the interlayer insulating film, it has become very difficult to control the working of the interlayer insulating film on the occasion of forming a fuse window. Further, when a low-k film is employed as an interlayer insulating film in order to enhance the processing speed of semiconductor device, this low-k film will be damaged by the laser blow to be employed in the cutting of the fuse, thus badly affecting the characteristics and reliability of the semiconductor device.

BRIEF SUMMARY OF THE INVENTION

A semiconductor device according to one embodiment of the present invention comprises:

a semiconductor substrate;

a first metal wiring and a fuse, both being formed as the same level above the semiconductor substrate;

a first insulating film deposited above the semiconductor substrate to cover the first metal wiring and the fuse, the first insulating film having a first pad opening arriving at the first metal wiring;

a second metal wiring formed at least within the first pad opening, the second metal wiring not extending above the fuse;

a stopper film formed on the first insulating film as well as on the second metal wiring; and a second insulating film formed above the stopper film;

wherein a second pad opening is formed to expose a portion of the second metal wiring by removing the second insulating film and the stopper film, a fuse opening is formed above at least the fuse by removing the second insulating film and the stopper film, and by removing the first insulating film to intermediate in thickness.

A method for manufacturing a semiconductor device according to one embodiment of the present invention comprises:

forming a first metal wiring and a fuse above a semiconductor substrate;

depositing a first insulating film above the semiconductor substrate to cover the first metal wiring and the fuse;

selectively etching the first insulating film deposited on the first metal wiring to form a first pad opening;

selectively forming a second metal wiring to contact with the first metal wiring through the first pad opening;

forming a stopper film on the first insulating film and on the second metal wiring;

forming a second insulating film above the stopper film;

selectively etching parts of the second insulating film which correspond to a portion of the second metal wiring and to at least a portion of the fuse, thereby exposing a part of the stopper film; and etching away the part of the stopper film that has been exposed by the selective etching of the second insulating film.

DETAILED DESCRIPTION OF THE INVENTION

According to the embodiments of the present invention, a metal wiring (a first metal wiring) which is disposed below next to a metal pad (a second metal wiring) is employed as a fuse, wherein a stopper film is formed on a first insulating film interposed between the first and second metal wirings, as well as on the second metal wiring. Further, after a second insulating film has been formed above the stopper film, etching is performed in two steps, i.e. the selective etching of the second insulating film and the selective etching of the stopper film. Owing to these procedures, it becomes possible not only to stably secure a residual insulating film over a fuse but also to reliably form a pad opening.

More specifically, after a photoresist is patterned to provide it with patterns of pad portions and fuse window portions, the resultant photoresist pattern is employed as a mask to perform the etching of the second insulating film until the stopper film is exposed under the conditions which ensure a substantial etching selectivity ratio between the second insulating film and the stopper film. For example, in a case where a silicon oxide film is employed as the second insulating film and a silicon nitride film is employed as the stopper film, dry etching using a mixed gas comprising, for example, $C_4F_8+CO+Ar$ is performed, thereby making it possible to easily perform the dry etching work of the second insulating film while ensuring a sufficient selectivity ratio relative to the stopper film. By optimizing the etching conditions, this selectivity ratio can be enhanced up to about 10, so that it is now possible to perform a sufficient over-etching and hence to achieve a stabilized working of the second insulating film.

Further, when performing the etching of the stopper film subsequent to the working of the second insulating film, if the film thickness of the stopper film is preliminarily made sufficiently thin relative to the film thickness of the first insulating film, it is possible, concurrent with the etching of the first insulating film at the fuse opening, to perform a sufficient over-etching of the first insulating film relative to the etching of the stopper film.

As a result, it is now possible not only to stably secure a residual insulating film on a fuse but also to reliably form a pad opening, thereby making it possible to enhance the characteristics and reliability of the device.

As means for solving these conventional problems, it is conceivable to employ, as a fuse, a metal wiring layer disposed below next to the metal pad. Further, in order to simplify the manufacturing process, it is desired to perform the working of the pad portion and the formation of the fuse window by a single patterning process (en bloc opening work). However, when the over-etching is performed to a sufficient extent in the working of the pad opening by using the en bloc opening work according to the conventional technique, it becomes difficult to leave an interlayer insulating film at the fuse window portion, thus the fuse is exposed and hence possibly badly affecting the characteristics and reliability of the device.

Figure 1A:
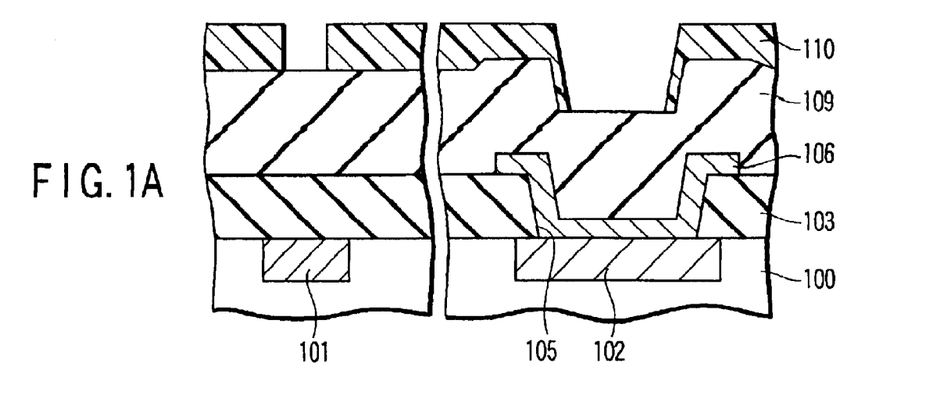
FIGS. 1A to 1C respectively shows a cross-sectional view illustrating the element structure of a semiconductor device wherein a metal wiring layer which is disposed below next to the metal pad is employed as a fuse, and the problems accompanied with such a structure of a semiconductor device.

Following are explanations about the phenomena mentioned above, with reference to FIGS. 1A to 1C. As shown in FIG. 1A, a first interlayer insulating film 103 is deposited on the surface of a semiconductor substrate 100 having a fuse 101 and a first metal wiring 102 formed in advance, and then, a first pad opening 105 is formed by exposure and dry etching. Thereafter, a metal wiring material is deposited on the exposed surface of the substrate 100 and by using exposure and dry etching, a second metal wiring (metal pad) 106 is formed. Then, after finishing the deposition of a second interlayer insulating film 109, a photoresist 110 having a pattern including openings corresponding to a fuse window portion and also to a second pad opening portion is formed thereon.

Figure 1B:
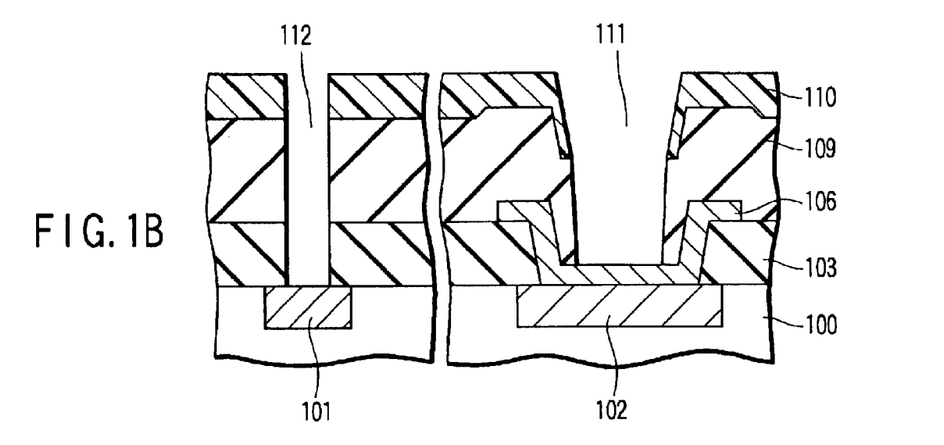

Then, as shown in FIG. 1B, by a dry etching, a fuse opening 112 and a second pad opening 111 are concurrently formed. On this occasion, in order to open the second pad opening 111 stably, an over-etching of about 50% is generally required, which however leads to the exposure of the fuse 101 due to this over-etching. The exposure of the fuse 101 will then lead to the corrosion of the fuse 101, thus badly affecting the characteristics and reliability of the device. For example, if the thickness of the first interlayer insulating film 103 is assumed to be 500 nm and the thickness of the second interlayer insulating film 109 is assumed to be 1000 nm, when a 50% over-etching is performed at the second pad opening 111, the fuse opening 112 penetrates completely.

Figure 1C:
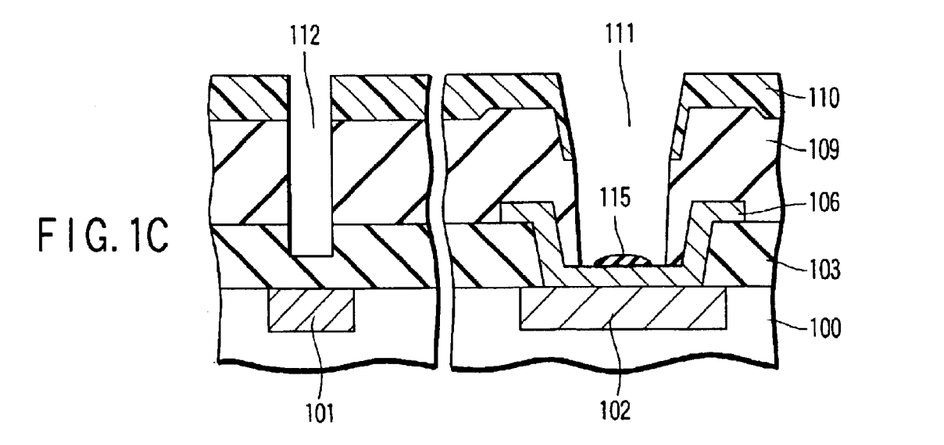

On the other hand, when it is tried to leave, without fail, a portion of the first interlayer insulating film 103 at the fuse opening 112 as shown in FIG. 1C, an etching residue 115 will be possibly left behind at the second pad opening 111, thereby giving rise to the conductivity failure of the pad portion.

As explained above, when it is tried to form the fuse by using the metal wiring which is disposed below next to the uppermost metal pad and to concurrently form the pad opening and the fuse opening by a single step of patterning in the manufacture of a semiconductor device such as a embedded memory device, it becomes very difficult to simultaneously realize the formation of the pad opening which is free from any residue of insulating film at the opening portion thereof and the formation of the fuse opening having a residual film of the insulating film left behind at the window portion thereof.

Therefore, according to the embodiments of the present invention, a stopper insulating film is provided to solve the aforementioned problems. The embodiments of the present invention will be explained as follows with reference with the drawings.

First Embodiment

Figure 2:
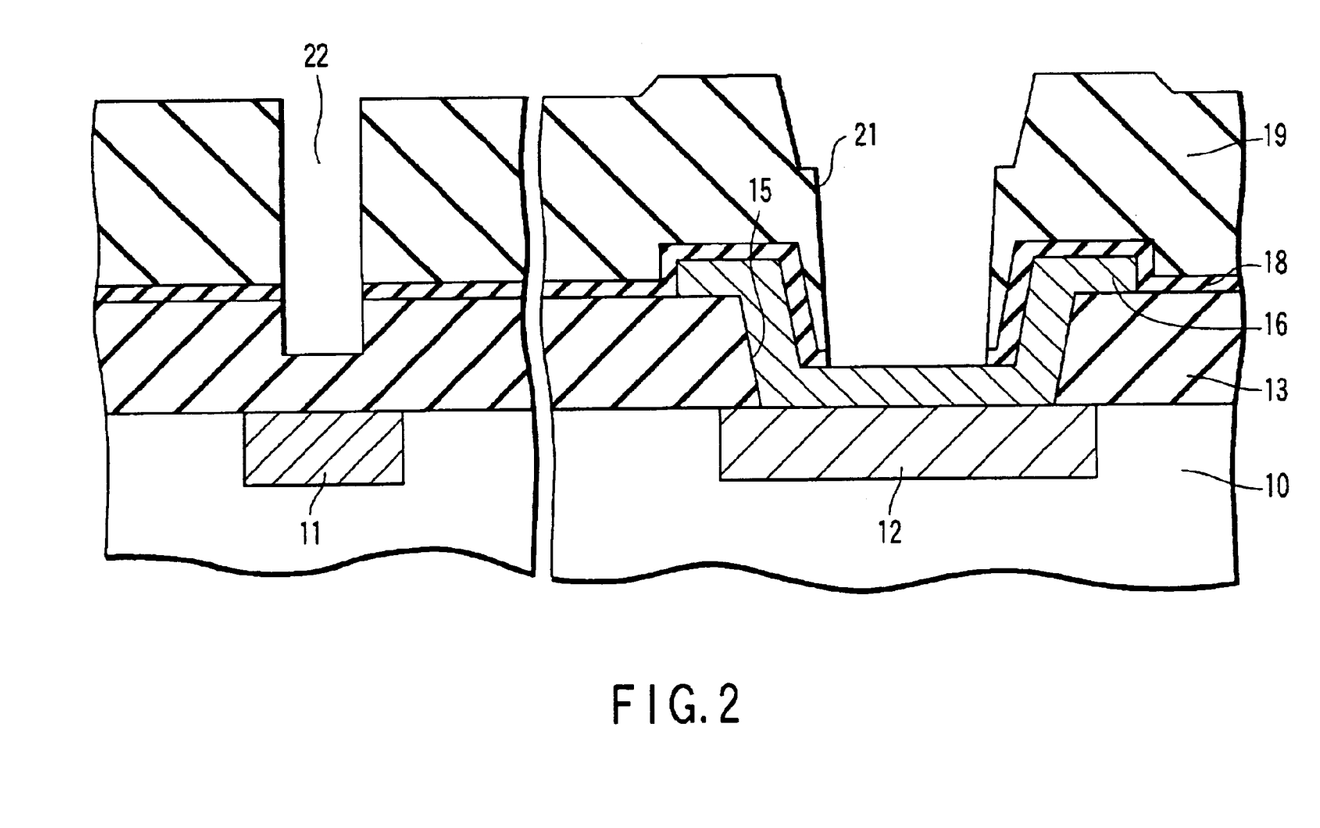
FIG. 2 is a cross-sectional view illustrating the element structure of the semiconductor device according to a first embodiment of the present invention.

FIG. 2 is a cross-sectional view illustrating the element structure of the semiconductor device according to a first embodiment of the present invention.

Referring to FIG. 2, 10 represents a semiconductor substrate provided in advance with various kinds of elements such as a MOS transistor (not shown) and with a wiring structure. The semiconductor substrate is also provided in the surface region thereof with a fuse 11 and a first metal wiring 12, both being buried in the surface region. On the substrate 10 is deposited a first interlayer insulating film 13 which is provided with a first pad opening 15 for enabling the first metal wiring 12 to be electrically contacted with a second metal wiring 16 which is formed in the first pad opening 15.

A stopper insulating film 18 is formed on the first interlayer insulating film 13 and on the second metal wiring 16, and a second interlayer insulating film 19 is deposited on the stopper insulating film 18. Further, a portion of the second interlayer insulating film 19 as well as a portion of the stopper insulating film 18, both portions being located above the second metal wiring 16, are etched away to form a second pad opening 21. Additionally, a portion of the second interlayer insulating film 19 as well as a portion of the stopper insulating film 18, both portions being located over the fuse 11, are also etched away, and at the same time, the first interlayer insulating film 13 is also partially etched away, i.e. up to an intermediate portion in a thickness thereof, thereby forming a fuse opening 22.

Next, a method for manufacturing a semiconductor device according to this embodiment will be explained with reference to FIGS. 3A to 3G.

Figure 3A:
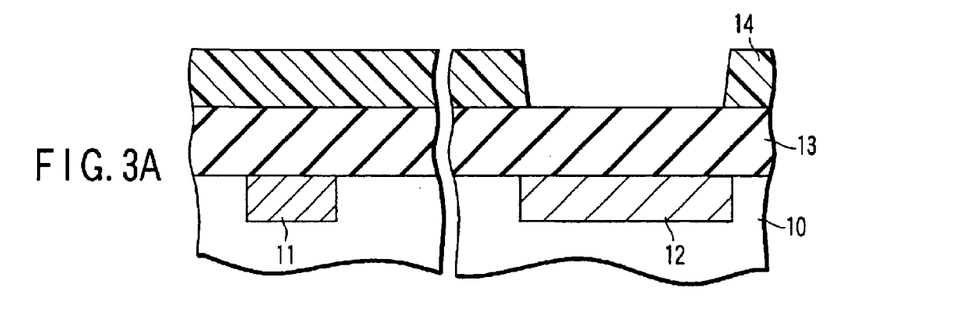
FIGS. 3A to 3G respectively shows a cross-sectional view illustrating the manufacturing steps of the semiconductor device according to a first embodiment of the present invention.

First of all, as shown in FIG. 3A, a first interlayer insulating film 13 is deposited on the semiconductor substrate 10 provided with a fuse 11 and a metal wiring 12 by using CVD, and then, a photoresist 14 having a predetermined pattern is formed on the first interlayer insulating film 13 by using lithography. Incidentally, the fuse 11 and the metal wiring 12 have been formed by so-called damascene process wherein a recessed portion having a depth of about 1 μm is formed in the interlayer insulating film deposited on the semiconductor substrate for instance, and then, Cu is buried in this recessed portion, the resultant surface being subsequently polished to flatten the surface, thereby forming the fuse 11 and the metal wiring 12. Further, the interlayer insulating film 13 is formed from TEOS (tetraethoxy silane) silicon oxide having a thickness of about 500 nm.

Figure 3B:
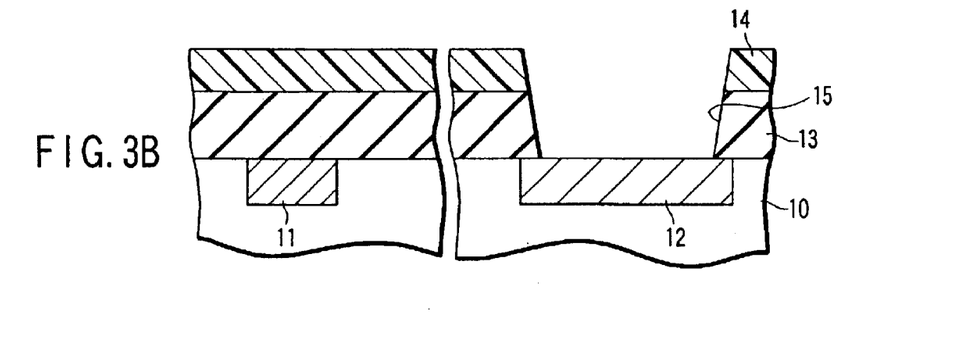

Then, as shown in FIG. 3B, by a dry etching using the photoresist 14 as a mask and also using a mixed gas such as $C_4F_8$+CO+Ar, the first interlayer insulating film 13 is selectively etched to form a first pad opening 15. Subsequently, by using ashing and wet washing, the photoresist 14 is removed.

Figure 3C:
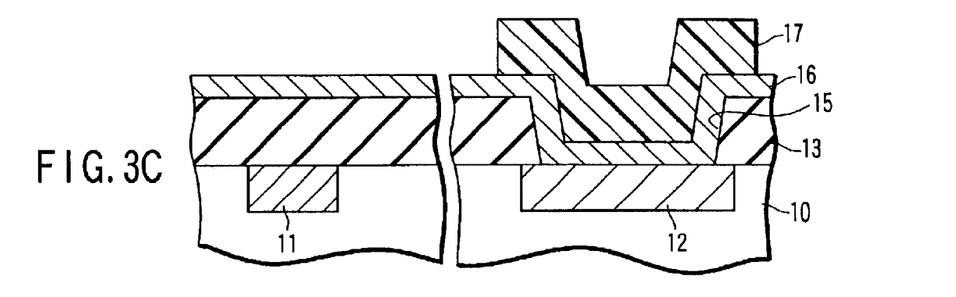

Then, as shown in FIG. 3C, by sputtering, the second metal wiring 16 is deposited on the inside of the first pad opening 15 and on the first interlayer insulating film 13. This metal wiring 16 is formed of Al having a thickness of 500 nm, for example. Then, by using lithography, the photoresist 17 having a pattern to cover the first pad opening 15 is formed on the metal wiring 16.

Figure 3D:
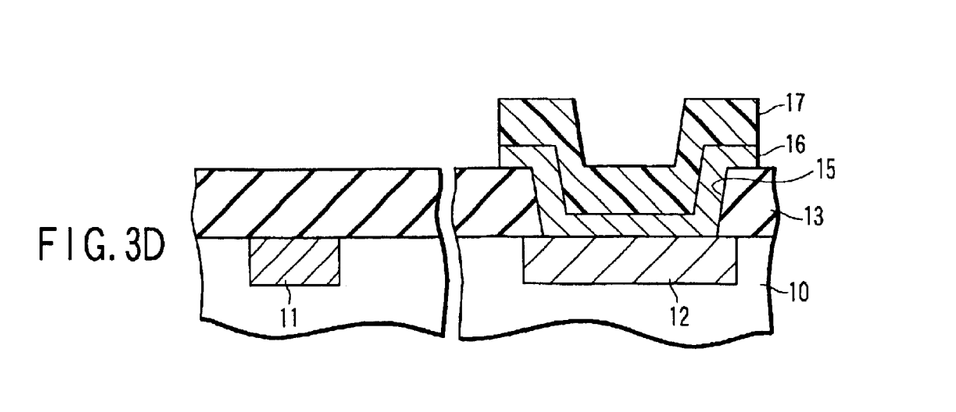

Then, as shown in FIG. 3D, by a dry etching using the photoresist 17 as a mask, the second metal wiring 16 is subjected to etching work. Thereafter, by using ashing and wet washing, the photoresist 17 is etched away. In this case, the second metal wiring 16 may be deposited only on the inside of the first pad opening 15 and on a region around the first pad opening 15. Alternatively, the second metal wiring 16 may be deposited so as to extend over the first interlayer insulating film 13. The portion of the second metal wiring 16 that has been extended over the first interlayer insulating film 13 may be utilized as a wiring.

Figure 3E:
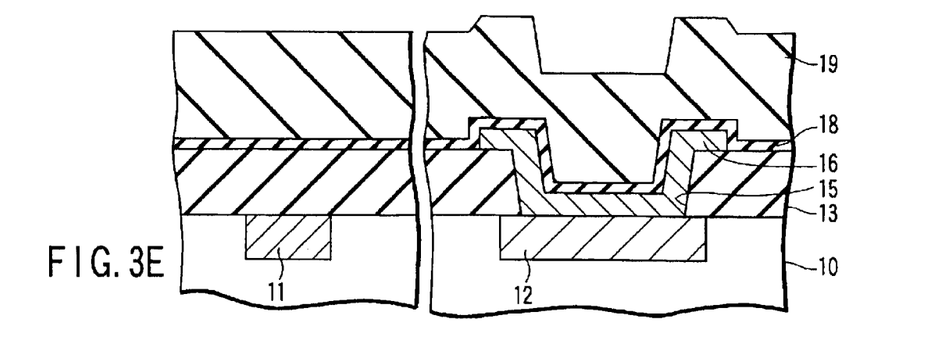

Then, as shown in FIG. 3E, by CVD, the stopper insulating film 18 made of a silicon nitride is deposited on the first interlayer insulating film 13 and on the second metal wiring 16. Then, by CVD, the second interlayer insulating film 19 made of TEOS is deposited on the stopper insulating film 18. In this case, the thickness of the stopper insulating film 18 is required to be sufficiently thin relative to the thickness of the first interlayer insulating film 13. For example, the stopper insulating film 18 is formed to have a thickness of 100 nm. On the other hand, the second interlayer insulating film 19 is formed to have a thickness of 1 μm for instance.

Figure 3F:
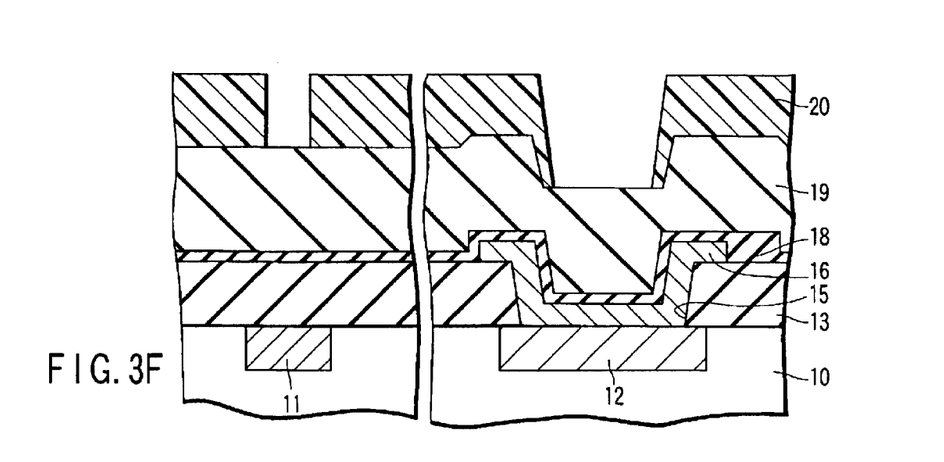

Then, as shown in FIG. 3F, a photoresist 20 is coated on the second interlayer insulating film 19, and by using lithography, the formation of the second pad opening pattern and the formation of the fuse window pattern are concurrently formed by a single patterning step.

Figure 3G:
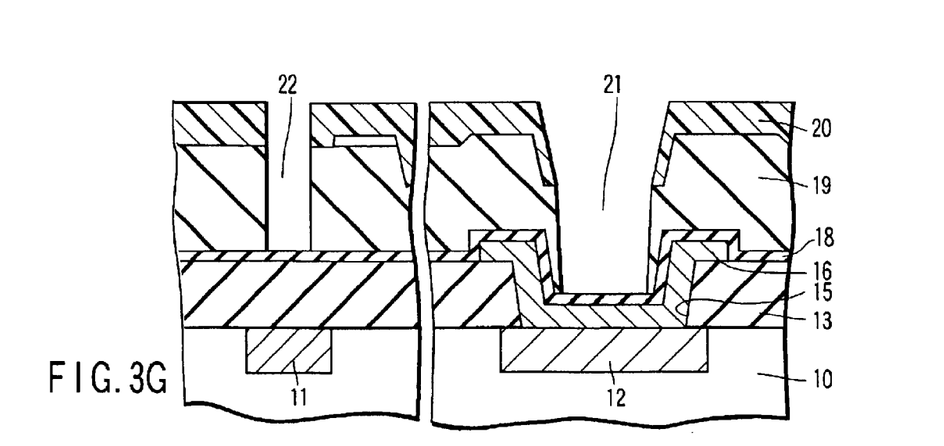

Then, as shown in FIG. 3G, by using the photoresist 20 as a mask, the second interlayer insulating film 19 is subjected to etching until the stopper insulating film 18 is exposed under etching conditions ensuring a sufficient selective ratio relative to the stopper insulating film 18. In this case, in order to enable the portion corresponding to the second pad pattern to be completely opened, the second interlayer insulating film 19 is over-etched by about 50%. As for the etching gas useful herein, a mixed gas containing $C_4F_8$+CO+Ar can be employed.

Subsequently, by dry etching using a $CHF_3$+$O_2$ mixed gas, the stopper insulating film 18 is etched with the photoresist 20 being employed as a mask. On this occasion, a portion of the first interlayer insulating film 13 which coincides with the fuse 11 and has been exposed due to the etching of the stopper insulating film 18 is half-etched. As a result, it is possible to simultaneously form the second pad opening 21 and the fuse opening 22. Subsequently, by using ashing and wet washing, the photoresist 20 is removed to accomplish the structure shown in FIG. 2.

As explained above, according to this embodiment, due to the over-etching of the second interlayer insulating film 19, it is now possible to reliably remove appropriate portions of this insulating film 19 located at the pad opening 21 and at the fuse opening 22. In this case, since the underlying layer of the second interlayer insulating film 19 is constituted by the stopper insulating film 18, there is little possibility that the first interlayer insulating film 13 is etched away at the fuse opening 22. Furthermore, since the stopper insulating film 18 is formed sufficiently thinner than the first interlayer insulating film 13, it is possible to reliably leave part of the first interlayer insulating film 13 at the fuse opening 22 even if the stopper insulating film 18 is over-etched.

Accordingly, the formation of the second pad opening 21 can be performed without any possibility of leaving behind a residual insulating film therein, and at the same time, part of the insulating film can be reliably and stably left behind in the fuse opening 22, thereby making it possible to enhance the characteristics and reliability of the device.

Incidentally, the removal of the photoresist 20 in this embodiment can be performed prior to the etching of the stopper insulating film 18. In this case, by using the photoresist 20 as a mask, the second interlayer insulating film 19 is subjected to etching work until the stopper insulating film 18 is exposed under etching conditions ensuring a sufficient selective ratio relative to the stopper insulating film 18. Thereafter, by using ashing and wet washing, the photoresist 20 is removed. The resultant surface is then entirely subjected to an etch-back treatment by using dry etching to perform the working of the stopper insulating film 18.

Figure 4:
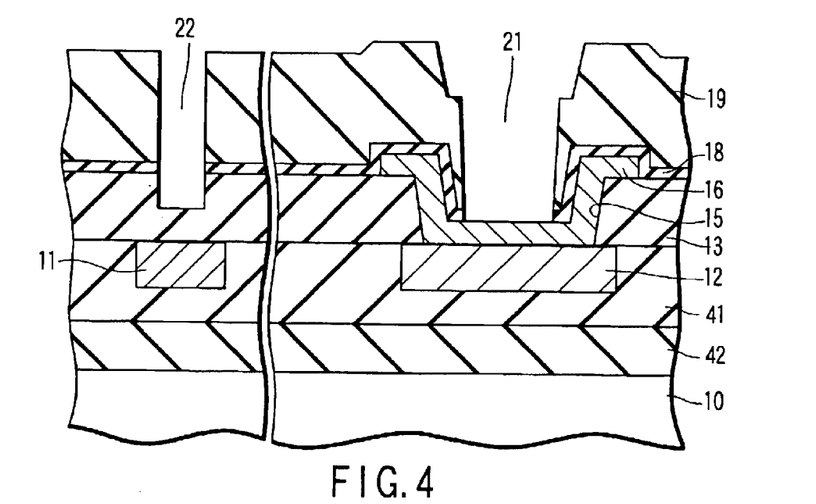
FIG. 4 is a cross-sectional view illustrating the element structure of the semiconductor device representing a modified example of the first embodiment of the present invention.

Further, it is possible to apply this embodiment to a structure where a low-k film 42 is disposed below the interlayer insulating film 41 with the fuse 11 and the first metal wiring 12 being buried therein as shown in FIG. 4. In this case, the interlayer insulating film 41 provided with the fuse 11 and the first metal wiring 12 may be formed of TEOS, and the low-k film 42 may be formed of a low dielectric constant film having a relative dielectric constant of less than 4, more preferably, 3 or less, such as polymethyl siloxane and polyarylene.

When constructed in this manner, it is possible to obtain the effect that the low-k film 42 can be prevented from being damaged on the occasion of the laser blow to the fuse 11. When the fuse is formed in a layer disposed next to the second layer 16 as counted downward from the metal pad, i.e. in the low-k film 42 as is the case of the conventional structure, damage will occur in this low-k film 42 on the occasion of the laser blow to the fuse 11, thus deteriorating the characteristics and reliability of the semiconductor device. Whereas, according to this embodiment, since the fuse 11 is formed below next to the metal pad, the problem mentioned above can be reliably overcome.

Second Embodiment

Figure 5:
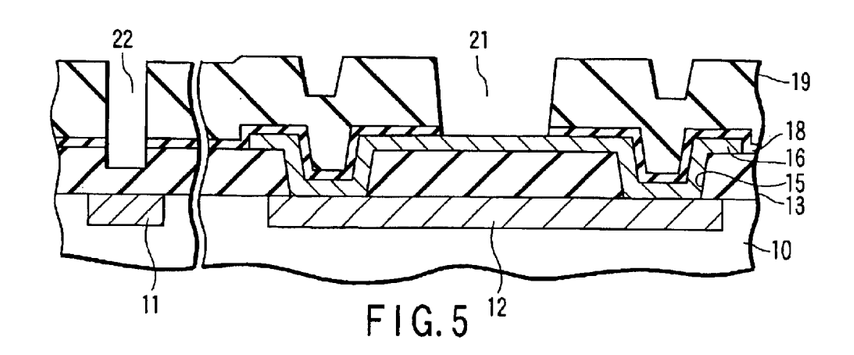
FIG. 5 is a cross-sectional view illustrating the element structure of the semiconductor device according to a second embodiment of the present invention.

FIG. 5 is a cross-sectional view illustrating the element structure of the semiconductor device according to a second embodiment of the present invention. Incidentally, the same portions as those of FIG. 2 are identified by the same reference symbols, thereby omitting the detailed explanation thereof.

The main feature by which this embodiment can be distinguished from the aforementioned first embodiment resides in that the position of the second pad opening is off-set from the first pad opening.

Although the fundamental manufacturing steps according to this embodiment are substantially the same as those of the first embodiment, this embodiment differs from the first embodiment in that the first pad opening 15 is not limited to only one place on the first metal wiring 12 but is formed at plural portions around the periphery of the first metal wiring 12 or formed ring-like along the periphery of the first metal wiring 12. Further, the second metal wiring 16 is formed not only in the first pad opening 15 but also on the first interlayer insulating film 13 disposed on the first metal wiring 12. Furthermore, the second pad opening 21 is formed not above the first pad opening 15 which is formed along the periphery of the first metal wiring 12 but above a central portion of the first metal wiring 12, i.e. above a portion of the second metal wiring 16 deposited on the first interlayer insulating film 13, the location of which coincides with a central portion of the first metal wiring 12.

When constructed in this manner, it is possible to obtain not only the same effect as that of the aforementioned first embodiment but also the additional effect as explained below. Namely, since the wire bonding is performed not through the portion where the second metal wiring 16 is directly formed on the first metal wiring 12 but through a portion of the second metal wiring 16 which is placed on the first interlayer insulating film 13, any damage due to the wire bonding can be absorbed by the insulating film 13, thereby making it possible to prevent the first metal wiring 12 from being damaged by the wire bonding.

Third Embodiment

Figure 6:
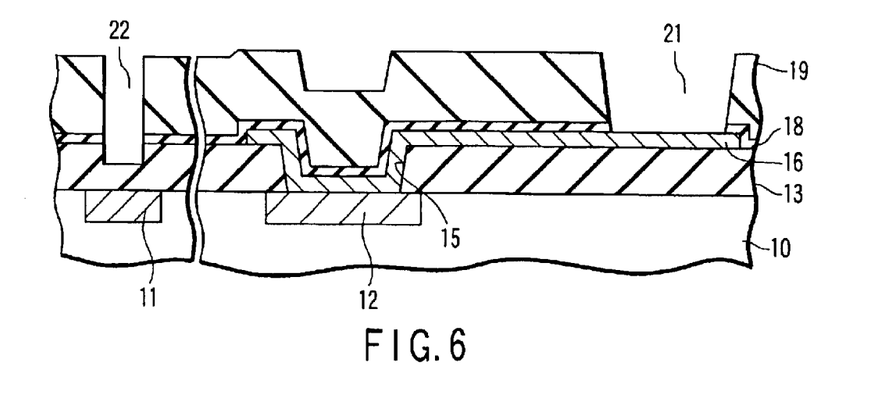
FIG. 6 is a cross-sectional view illustrating the element structure of the semiconductor device according to a third embodiment of the present invention.

FIG. 6 is a cross-sectional view illustrating the element structure of the semiconductor device according to a third embodiment of the present invention. Incidentally, the same portions as those of FIG. 2 are identified by the same reference symbols, thereby omitting the detailed explanation thereof.

The main feature by which this embodiment can be distinguished from the aforementioned first embodiment resides in that the second metal wiring 16 is utilized also as a lead, and the position of the second pad opening 21 is off-set from the first pad opening 15.

Although the fundamental manufacturing steps according to this embodiment are substantially the same as those of the first embodiment, this embodiment differs from the first embodiment in that the second metal wiring 16 is formed not only in the first pad opening 15 and the peripheral region thereof but also on a region of the first interlayer insulating film 13 which is located away from the first pad opening 15. Furthermore, the second pad opening 21 is formed not to expose the second metal wiring 16 at the first pad opening 15 but to expose the second metal wiring 16 formed on the first interlayer insulating film 13.

When constructed in this manner, it is possible to obtain almost the same effect as that of the aforementioned second embodiment. Moreover, since the second metal wiring 16 is employed also as a lead, the degree of freedom in positioning the second pad opening 21 will be increased.

The present invention should not be construed as being limited to the aforementioned embodiments. For example, the material useful for the first metal wiring is not limited to the simple substance of Cu but may be formed of a material containing Cu as a main component. Further, a material mainly containing Ag may be substituted for Cu. Further, as for the material for the second metal wiring, the material useful herein is not limited to the simple substance of Al but may be formed of a material containing Al as a main component. Furthermore, the material for the second metal wiring is not be limited to Al. Namely, the material for the second metal wiring may be constituted by any kind of materials as far as they are more excellent in oxidation resistance and corrosion resistance as compared with the material constituting the first metal wiring. The wiring to be formed on the substrate may be constituted by an ordinary wiring which can be formed by RIE for instance.

As for the stopper insulating film, it is desirable to employ a material which can be hardly etched in the etching process of the second interlayer insulating film. For example, when the second interlayer insulating film is formed of TEOS, the material for the stopper insulating film may be selected from silicon nitride and silicon carbide. In this manner, the present invention can be variously modified within the spirit thereof.

As explained above in detail, according to the embodiments of the present invention, it becomes possible not only to stably secure a residual insulating film on a fuse but also to reliably form a pad opening in a structure where a metal wiring which is disposed below next to a metal pad is employed as a fuse, thereby making it possible to enhance the characteristics and reliability of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first metal wiring and a fuse, both being formed as the same level above said semiconductor substrate;
   a first insulating film deposited above said semiconductor substrate to cover said first metal wiring and said fuse, said first insulating film having a first pad opening arriving at said first metal wiring;
   a second metal wiring formed at least within said first pad opening, said second metal wiring not extending above said fuse and being formed of a material which is higher in resistance to oxidation or corrosion than that of said first metal wiring;

a stopper film formed on said first insulating film as well as on said second metal wiring; and a second insulating film formed above said stopper film;

wherein a second pad opening is formed to expose a portion of said second metal wiring by removing said second insulating film and said stopper film, a fuse opening is formed above at least said fuse by removing said second insulating film and said stopper film, and by removing said first insulating film to intermediate in thickness.

2. The semiconductor device according to claim 1, wherein said stopper film is formed of a material which differs from that of said second insulating film and comprises at least one of silicon nitride and silicon carbide.

3. The semiconductor device according to claim 1, wherein said second insulating film is formed from TEOS.

4. The semiconductor device according to claim 1, wherein said first metal wiring and said fuse are formed of a material selected from the group consisting of Cu, Ag and a metal containing Cu or Ag as a main component, and said second metal wiring is formed of Al or a metal containing Al as a main component.

5. The semiconductor device according to claim 1, wherein said first metal wiring and said fuse are buried inside a recessed portion formed in an interlayer insulating film.

6. The semiconductor device according to claim 5, further comprising a low dielectric interlayer insulating film below said interlayer insulating film having said first metal wiring and said fuse buried therein, said low dielectric interlayer insulating film having a relative dielectric constant of less than 4.

7. The semiconductor device according to claim 1, wherein said second pad opening is disposed above said first pad opening.

8. The semiconductor device according to claim 1, wherein said second metal wiring is extended from inside of said first pad opening to cover a portion of said first insulating film and said second pad opening is formed above said portion of said first insulating film.

9. The semiconductor device according to claim 1, wherein said first pad opening is formed above a peripheral portion of said first metal wiring, and said second pad opening is formed above a portion of said first insulating film which is located over a central portion of said first metal wiring.

10. A semiconductor device comprising:

a semiconductor substrate;

a first metal wiring and a fuse, both being formed as the same level above said semiconductor substrate;

a first insulating film deposited above said semiconductor substrate to cover said first metal wiring and said fuse, said first insulating film having a first pad opening arriving at said first metal wiring;

a second metal wiring formed at least within said first pad opening, said second metal wiring not extending above said fuse and being extended from inside of said first pad opening to cover a portion of said first insulating film and said second pad opening is formed above said portion of said first insulating film;

a stopper film formed on said first insulating film as well as on said second metal wiring; and a second insulating film formed above said stopper film;

wherein a second pad opening is formed to expose a portion of said second metal wiring by removing said second insulating film and said stopper film, a fuse opening is formed above at least said fuse by removing said second insulating film and said stopper film, and by removing said first insulating film to intermediate in thickness.

11. The semiconductor device according to claim 10, wherein said stopper film is formed of a material which differs from that of said second insulating film and comprises at least one of silicon nitride and silicon carbide.

12. The semiconductor device according to claim 10, wherein said second insulating film is formed from TEOS.

13. The semiconductor device according to claim 10, wherein said second metal wiring is formed of a material which is higher in resistance to oxidation or corrosion than that of said first metal wiring.

14. The semiconductor device according to claim 10, wherein said first metal wiring and said fuse are formed of a material selected from the group consisting of Cu, Ag and a metal containing Cu or Ag as a main component, and said second metal wiring is formed of Al or a metal containing Al as a main component.

15. The semiconductor device according to claim 10, wherein said first metal wiring and said fuse are buried inside a recessed portion formed in an interlayer insulating film.

16. The semiconductor device according to claim 15, further comprising a low dielectric interlayer insulating film below said interlayer insulating film having said first metal wiring and said fuse buried therein, said low dielectric interlayer insulating film having a relative dielectric constant of less than 4.

17. The semiconductor device according to claim 10, wherein said first pad opening is formed above a peripheral portion of said first metal wiring, and said second pad opening is formed above a portion of said first insulating film which is located over a central portion of said first metal wiring.

* * * * *